US012635167B2

(12) United States Patent
Lee et al.

(10) Patent No.: US 12,635,167 B2
(45) Date of Patent: May 19, 2026

(54) DRAIN CONTACT EXTENSION LAYOUT FOR HARD SWITCHING ROBUSTNESS

(71) Applicant: Texas Instruments Incorporated, Dallas, TX (US)

(72) Inventors: Dong Seup Lee, McKinney, TX (US); Jungwoo Joh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 730 days.

(21) Appl. No.: 17/499,462

(22) Filed: Oct. 12, 2021

(65) Prior Publication Data

US 2022/0231156 A1     Jul. 21, 2022

Related U.S. Application Data

(60) Provisional application No. 63/139,889, filed on Jan. 21, 2021.

(51) Int. Cl.
| | |
|---|---|
| *H10D 30/47* | (2025.01) |
| *H10D 30/01* | (2025.01) |
| *H10D 62/10* | (2025.01) |
| *H10D 62/85* | (2025.01) |
| *H10D 64/23* | (2025.01) |
| *H10D 64/27* | (2025.01) |

(52) U.S. Cl.
CPC ......... *H10D 30/475* (2025.01); *H10D 30/015* (2025.01); *H10D 62/117* (2025.01); *H10D 62/124* (2025.01); *H10D 62/126* (2025.01); *H10D 64/258* (2025.01); *H10D 64/517* (2025.01); *H10D 64/518* (2025.01); *H10D 64/519* (2025.01); *H10D 62/8503* (2025.01)

(58) Field of Classification Search
CPC ......... H01L 29/42372–4238; H01L 29/41775; H01L 29/2003; H10D 40/375; H10D 64/518–519; H10D 30/475; H10D 30/015; H10D 64/257–258; H10D 62/124–126
See application file for complete search history.

(56) References Cited

U.S. PATENT DOCUMENTS

| | | | | |
|---|---|---|---|---|
| 5,313,083 | A * | 5/1994 | Schindler | ............... H10D 30/87 257/280 |
| 9,520,489 | B2 * | 12/2016 | Nakayama | ......... H10D 62/8503 |
| 2016/0240646 | A1 * | 8/2016 | Chiu | ................... H10D 30/4755 |
| 2018/0151713 | A1 * | 5/2018 | Joh | ....................... H10D 62/117 |
| 2020/0152788 | A1 * | 5/2020 | Kocon | ............. H01L 21/76202 |
| 2020/0273974 | A1 * | 8/2020 | Guidry | ................. H10D 30/015 |
| 2022/0199822 | A1 * | 6/2022 | Hao | ..................... H10D 62/114 |

OTHER PUBLICATIONS

Dubey, S.K., Islam, A. (2020). Effect of Source, Drain and Channel Spacing from Gate of HEMT. In: Sikander, A., et al.; Energy Systems, Drives and Automations. Lecture Notes in Electrical Engineering, vol. 664. Springer, Singapore. https://doi.org/10.1007/97 (Year: 2020).*

* cited by examiner

*Primary Examiner* — Christine S. Kim
*Assistant Examiner* — Tyler J Wiegand
(74) *Attorney, Agent, or Firm* — Yudong Kim; Frank D. Cimino

(57) ABSTRACT

A microelectronic device includes a GaN FET on a substrate such as silicon and a buffer layer of III-N semiconductor material. The GaN FET includes both source contacts and drain contacts to a channel layer of III-N semiconductor material. Source contacts to the source region are placed farther from the gate electrode fingertip than drain contacts to the drain region.

36 Claims, 9 Drawing Sheets

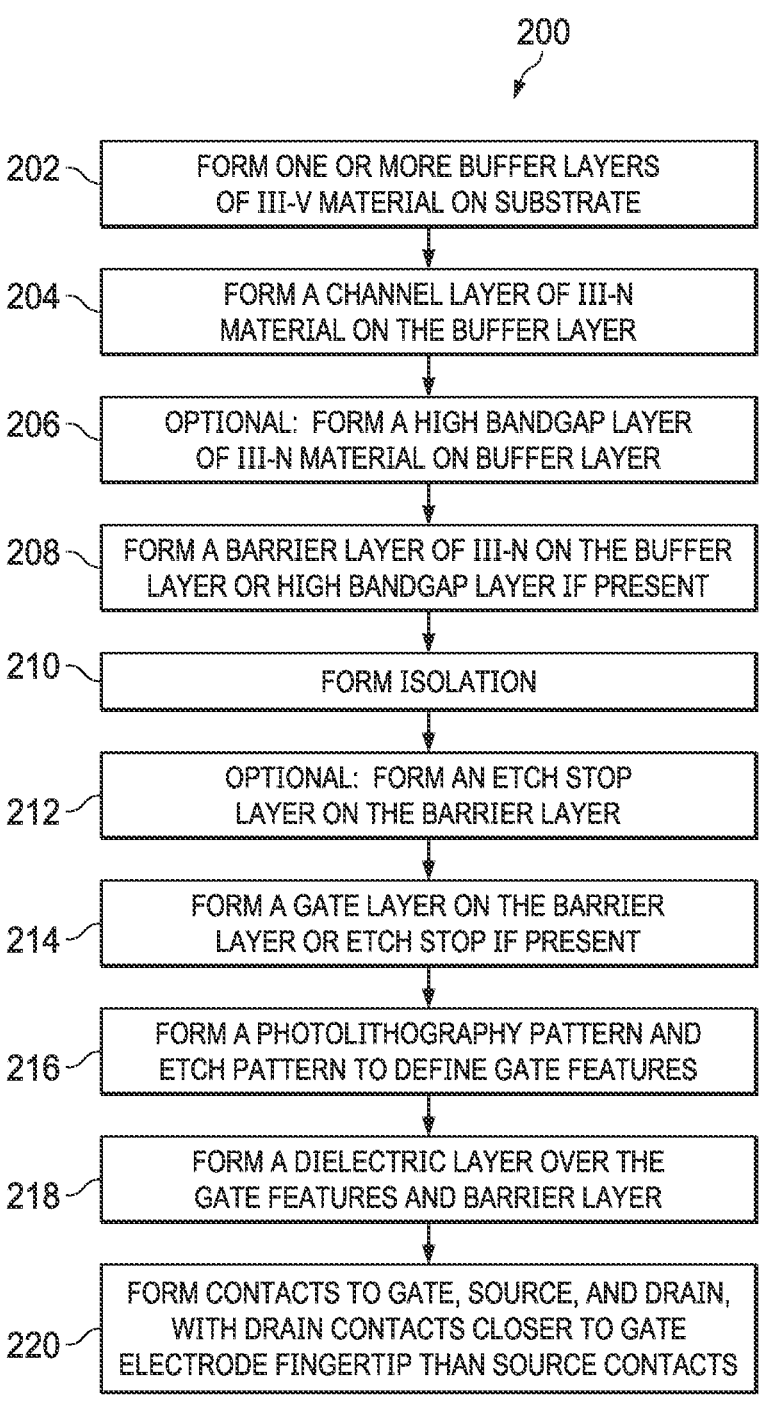

*200*

202 — FORM ONE OR MORE BUFFER LAYERS OF III-V MATERIAL ON SUBSTRATE

204 — FORM A CHANNEL LAYER OF III-N MATERIAL ON THE BUFFER LAYER

206 — OPTIONAL: FORM A HIGH BANDGAP LAYER OF III-N MATERIAL ON BUFFER LAYER

208 — FORM A BARRIER LAYER OF III-N ON THE BUFFER LAYER OR HIGH BANDGAP LAYER IF PRESENT

210 — FORM ISOLATION

212 — OPTIONAL: FORM AN ETCH STOP LAYER ON THE BARRIER LAYER

214 — FORM A GATE LAYER ON THE BARRIER LAYER OR ETCH STOP IF PRESENT

216 — FORM A PHOTOLITHOGRAPHY PATTERN AND ETCH PATTERN TO DEFINE GATE FEATURES

218 — FORM A DIELECTRIC LAYER OVER THE GATE FEATURES AND BARRIER LAYER

220 — FORM CONTACTS TO GATE, SOURCE, AND DRAIN, WITH DRAIN CONTACTS CLOSER TO GATE ELECTRODE FINGERTIP THAN SOURCE CONTACTS

DRAIN CONTACT EXTENSION LAYOUT FOR HARD SWITCHING ROBUSTNESS

CROSS-REFERENCE TO RELATED APPLICATIONS

This application is related to U.S. Provisional Patent Application No. 63/139,889, filed on Jan. 21, 2021, and hereby incorporated herein by reference in its entirety.

FIELD

This disclosure relates to the field of microelectronic devices. More particularly, but not exclusively, this disclosure relates to semiconductor components having contact layout designs optimized for switching robustness.

BACKGROUND

Semiconductor components are being continually improved to operate at higher potentials where switching robustness is critical to device reliability. Fabricating reliable semiconductor components that have increasingly higher performance is challenging.

SUMMARY

The present disclosure introduces a microelectronic device including improved design elements. The microelectronic device includes a gallium nitride field effect transistor (GaN-FET) with a contact layout design which containing a difference in distance between the contact and the end of the FET gate electrode for source and drain contacts. Also included are designs in which the gate electrode is entirely on the active region and designs where the end of the gate electrode extends over the GaN FET isolation.

BRIEF DESCRIPTION OF THE VIEWS OF THE DRAWINGS

FIG. 2 presents a flowchart of an example method of forming the microelectronic device of shown in FIG. 1A, FIG. 1B and FIG. 1C.

FIG. 3 is a top down view of a GaN FET with a gate electrode fingertip terminating on isolation and a difference in distance between source and drain contacts to the termination of the gate electrode fingertip.

DETAILED DESCRIPTION

Figure 1A:
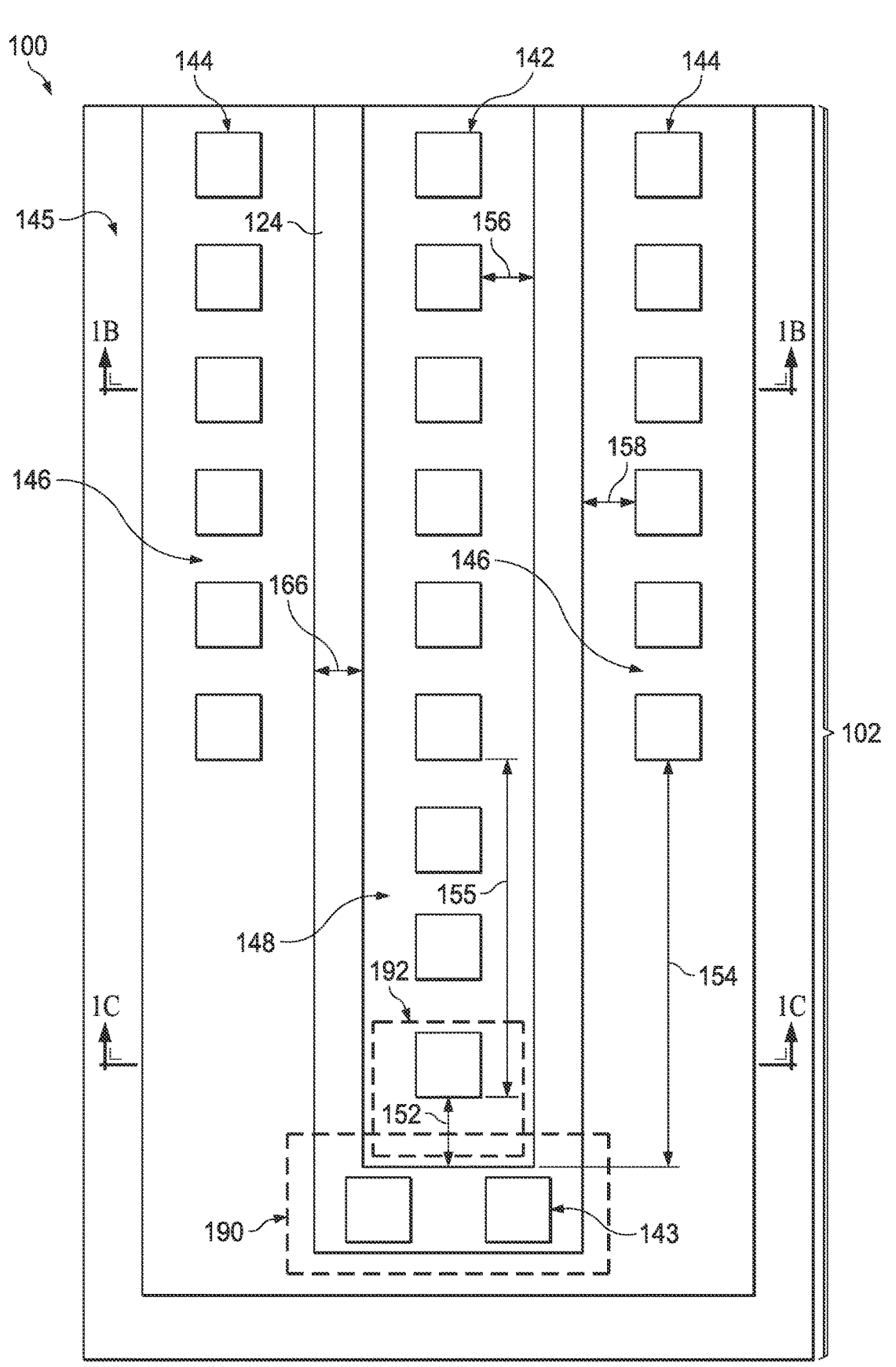
FIG. 1A is a top down view of GaN FET a gate electrode fingertip terminating on the active region and a difference in distance between source and drain contacts to the termination of the gate electrode fingertip.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A microelectronic device includes a gallium nitride field effect transistor, the GaN FET. The GaN FET has source and drain contacts in a finger layout. The drain contacts extend closer to a gate electrode fingertip than the source contacts to reduce current crowding in the drain contact to gate electrode fingertip area which results in improved hard switching reliability. The source and drain contacts may be incorporated into a depletion mode transistor, or an enhancement mode transistor.

In one example, the GaN FET has a channel layer of III-N semiconductor material including gallium and nitrogen that supports a two-dimensional electron layer, commonly referred to as the two-dimensional electron gas (2DEG). The GaN FET has a barrier layer of III-N semiconductor material including aluminum and nitrogen over the channel layer. The GaN FET further has a p-type gate electrode in a finger layout of III-N semiconductor material including gallium and nitrogen, the gate electrode. In one version, a bottom surface of the gate, adjacent to the barrier layer, does not extend past a top surface of the barrier layer, located opposite from the channel layer. The GaN FET may use a gate dielectric on top of the barrier layer, but some versions of GaN FET's may not have a gate dielectric layer. There is no dielectric layer between the gate and the barrier layer. In this example, the GaN FET has a gate-source threshold potential, referred to herein as the threshold potential, between −20 volts and 0 volts for depletion mode devices and a threshold potential of greater than 0 volts in enhanced mode devices.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide another portion of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. For example, aluminum gallium nitride may be written as AlGaN, which covers a range of relative proportions of aluminum and gallium.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane of top surface of the channel layer.

FIG. 1A shows a top down view of a microelectronic device 100 including a gallium nitride field effect transistor 102, with a finger layout referred to as the GaN FET 102. The GaN FET 102 contains a source access region 146, and a drain access region 148, a gate electrode 124 between the source access region 146 and the drain access region 148, a row of source contacts 144 in the source access region 146 with an end source contact 144 closest to the gate electrode fingertip 190, a row of drain contacts 142 in the drain access region 148 with an end drain contact 142 closest to the gate electrode fingertip 190, gate contacts 143 on the gate electrode fingertip 190 which is part of the gate electrode 124. The gate electrode 124 has a minimum gate length 166. The microelectronic device 100 contains a drain contact to end of gate electrode fingertip space 152 and a source contact to end of gate electrode fingertip space 154. A delta contact space 155 is defined as the source contact to end of gate electrode fingertip space 154 minus the drain contact to end of gate electrode fingertip space 152. The microelectronic device 100 also has a minimum drain contact to gate electrode space 156 and a minimum source contact to gate electrode space 158. In FIG. 1A, the delta contact space 155 is greater than two times the minimum source contact to gate electrode space 158, that is, the drain contacts 142 extend past the source contacts 144 by at least 2 times the drain contact to end of gate electrode fingertip space 152. The complete end drain contact 142 extends past the end source contact 144 in a direction toward the gate electrode fingertip area 192. FIG. 1A shows multiple drain contacts 142 (e.g., 3) extending past the end source contact 144 in the direction toward the gate electrode fingertip area 192. It is advantageous in the layout shown in FIG. 1A for the drain contacts 142 to be closer to the end of the gate electrode fingertip 190 than the source contacts 144 by a distance such that the delta contact space 155 is greater than two times the minimum source contact to gate electrode space 158, as a delta contact space 155 greater than two times the minimum source contact to gate electrode space 158 reduces current crowding in the drain contact to gate electrode fingertip area 192 which results in improved hard switching reliability.

Figure 1B:
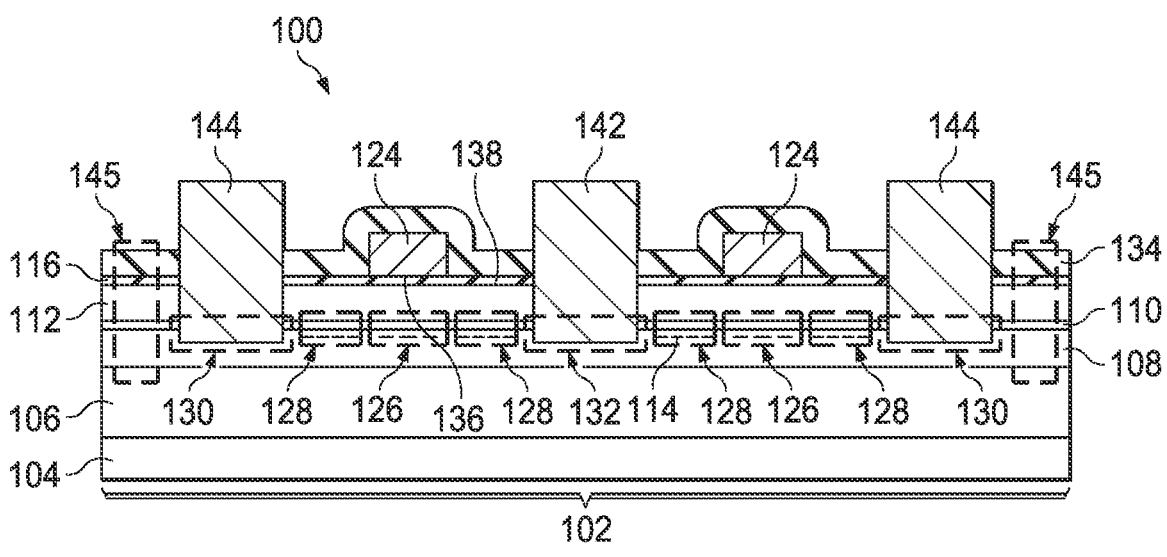
FIG. 1B is a cross section of the microelectronic device of FIG. 1A in a region containing both source and drain contacts.

FIG. 1B is a cross section of an example GaN FET structure that may be used in the microelectronic device 100 to accomplish the GaN FET 102 of FIG. 1A. The microelectronic device 100 may be formed on a substrate 104 such as a silicon wafer, a sapphire wafer, or a silicon carbide wafer. The GaN FET 102 contains a buffer layer of III-N semiconductor material 106 (herein referred to as the buffer layer) of one or more layers of III-N semiconductor material on the substrate 104, a channel layer of III-N semiconductor material 108 (herein referred to as the channel layer), in this example gallium nitride over the buffer layer 106, an optional high bandgap layer of III-N semiconductor material 110 (herein referred to as the high bandgap layer) over the channel layer 108, and a barrier layer 112 of III-N semiconductor material over the optional high bandgap layer 110 if present and over the channel layer 108 if the optional high bandgap layer 110 is not present. The barrier layer 112 induces the 2DEG 114 in the channel layer 108 adjacent to the barrier layer 112. The 2DEG 114 includes a channel region 126 under the gate electrode 124 and an access regions 128 adjacent to the channel region 126. The 2DEG 114 includes a source region 130 in an area for a source of the GaN FET 102. The source region 130 is laterally separated from the channel region 126 by one of the access regions 128. The 2DEG 114 includes a drain region 132 in an area for a drain of the GaN FET 102. The drain region 132 is laterally separated from the channel region 126 by another of the access regions 128, and is located opposite from the source region 130.

The GaN-FET contains an optional etch stop layer 116 on the barrier layer 112. A gate electrode 124 is defined on the barrier layer 112 of the GaN-FET. The GaN FET contains a dielectric layer 134 over the gate electrode 124 and the optional etch stop layer 116 if present. The GaN-FET contains a contact to the gate (out of the plane of the cross section), as well as a drain contact 142 and a source contact 144. Both the drain contact 142 and the source contact 144 make contact through the barrier layer 112 and the optional high bandgap layer 110 to the channel layer 108. The GaN FET 102 contains an isolation region 145.

Figure 1C:
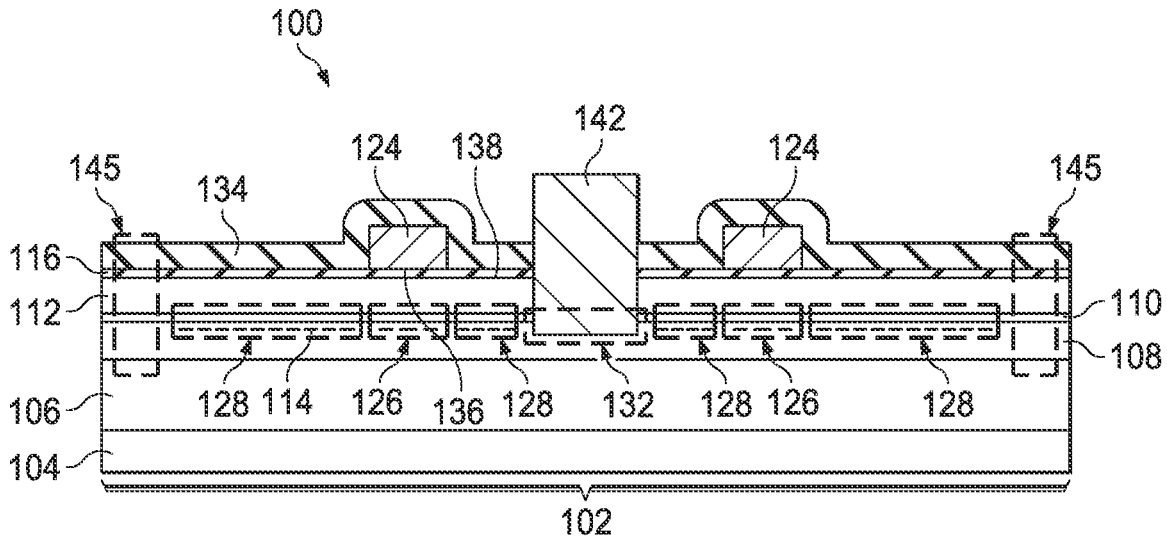
FIG. 1C is a cross section of the microelectronic device of FIG. 1A in a region containing only drain contacts.

FIG. 1C is a cross section of the microelectronic device 100 including the GaN FET 102. The drain contact 142 makes contact through the barrier layer 112 and the optional high bandgap layer 110 to the channel layer 108. The GaN FET contains an isolation region 145. The source contacts 144 are out of the plane of the cross section of FIG. 1C.

FIG. 2 presents a flowchart of an example method 200 of forming the microelectronic device 100 of FIG. 1A, 1B, and 1C. The method 200 includes step 202, which may include forming a buffer layer 106 on the substrate 104. In versions of this example in which the substrate 104 is implemented as a silicon wafer or a sapphire wafer, the buffer layer 106 may include a nucleation layer having a stoichiometry that includes aluminum, to match a lattice constant of the substrate 104. The buffer layer 106 may further include sublayers of gallium aluminum nitride with decreasing aluminum content, culminating in an unintentionally doped gallium nitride layer. The buffer layer 106 on silicon or sapphire may be 1 micron to several microns thick. In versions of this example in which the substrate 104 is implemented as a silicon carbide wafer, the buffer layer 106 may be thinner, due to a closer match in lattice constant between gallium nitride and silicon carbide. The buffer layer 106 may be formed by a buffer metal organic vapor phase epitaxy (MOVPE) process with several operations to form the nucleation layer and sublayers. The buffer layer 106 overlaps an area for the GaN FET 102.

The method 200 continues with step 204 which includes forming a channel layer 108 of III-N semiconductor material on the buffer layer 106. The channel layer 108 includes gallium and nitrogen, and may include primarily gallium nitride, with optional trace amounts of other group III elements, such as aluminum or indium. The channel layer 108 may be formed by a channel MOVPE process using a gallium-containing gas reagent and a nitrogen-containing gas reagent. The substrate 104 may be heated to 900° C. to 1100° C. during the channel MOVPE process. The gallium-containing gas reagent may be implemented as trimethyl-gallium or triethylgallium, for example. The nitrogen-containing gas reagent may be implemented as ammonia, hydrazine, or 1,1 dimethylhydrazine, for example. The channel MOVPE process uses a carrier gas. The carrier gas may include primarily hydrogen gas, or may include hydrogen with another gas such as nitrogen. The channel layer 108 may be 1 nanometer to 10 nanometers thick, by way of example. In an alternate version of this example, the channel layer 108 may be formed as a last portion of the buffer layer 106. During operation of the GaN FET 102, the channel layer 108 supports a 2DEG 114.

The method 200 continues with step 206 in includes forming an optional high bandgap layer 110 of III-N semiconductor material on the channel layer 108. The optional high bandgap layer 110 includes primarily aluminum and nitrogen, to provide a higher bandgap than a subsequently-formed barrier layer 112. In some versions of this example, the optional high bandgap layer 110 may consist essentially of aluminum nitride, with trace amounts of other group III elements, such as gallium.

The optional high bandgap layer 110 may be formed by a high bandgap MOVPE process using an aluminum-containing gas reagent and a nitrogen-containing gas reagent. The aluminum-containing gas reagent may be implemented as trimethylaluminum or triethylaluminum, for example. The nitrogen-containing gas reagent may be implemented as ammonia, hydrazine, or 1,1 dimethylhydrazine, as disclosed in reference to forming the channel layer 108. The substrate 104 may be heated to 900° C. to 1100° C. during the high bandgap MOVPE process. The high bandgap MOVPE process uses a carrier gas. The carrier gas may include primarily hydrogen gas, or may include hydrogen with another gas such as nitrogen. The optional high bandgap layer 110 may be 0.5 nanometers to 3 nanometers thick, by way of example. The optional high bandgap layer 110, if formed, may improve charge confinement in a subsequently-formed 2DEG 114, by providing a deeper quantum well in the channel layer 108, advantageously providing an increased free charge carrier density in the 2DEG 114.

The method 200 continues with step 208 which includes forming the barrier layer 112 of III-N semiconductor material over the channel layer 108, on the optional high bandgap layer 110, if present. The barrier layer 112 may include aluminum and nitrogen. In one version of this example, the barrier layer 112 may include gallium, at a lower atomic percent than the aluminum. In another version of this example, the barrier layer 112 may have a stoichiometry of $Al_{0.83}In_{0.17}N$, within a few atomic percent, which provides a close lattice match to gallium nitride. In a further version, the barrier layer 112 may include gallium and indium; the gallium may improve uniformity of the indium in the barrier layer 112. The barrier layer 112 may have a thickness of 1 nanometer to 60 nanometers.

The barrier layer 112 may be formed by a barrier MOVPE process using an aluminum-containing gas reagent and a nitrogen-containing gas reagent. The aluminum-containing gas reagent may be implemented as trimethylaluminum or triethylaluminum, for example. The nitrogen-containing gas reagent may be implemented as ammonia, hydrazine, or 1,1 dimethylhydrazine, as disclosed in reference to forming the channel layer 108.

In versions of this example in which the barrier layer 112 includes gallium, the barrier MOVPE process uses a gallium-containing gas reagent in addition to the aluminum-containing gas reagent and the nitrogen-containing gas reagent. The gallium-containing gas reagent may be implemented as trimethylgallium or triethylgallium, as disclosed in reference to forming the channel layer 108. In versions of this example in which the barrier layer 112 includes indium, the barrier MOVPE process uses an indium-containing gas reagent. The indium-containing gas reagent may be implemented as trimethylindium or triethylindium, for example. The barrier MOVPE process uses a carrier gas. The carrier gas may include primarily hydrogen gas, or may include hydrogen with another gas such as nitrogen. The substrate 104 may be heated to 900° C. to 1100° C. during the barrier MOVPE process.

The barrier layer 112 induces the 2DEG 114 in the channel layer 108 adjacent to the barrier layer 112. The stoichiometry and thickness of the barrier layer 112 may provide a free charge carrier density of $3 \times 10^{12}$ cm$^{-2}$ to $2 \times 10^{13}$ cm$^{-2}$, to provide a desired on-state resistance for the GaN FET 102.

The method 200 continues with step 210 which includes forming an isolation region 145 surrounding the GaN FET 102. To form the isolation region 145, a photolithography step is used to cover the GaN FET 102 leaving the isolation region 145 exposed to an isolation region implant (not specifically shown). The isolation region implant may include an implant of argon, silicon, fluorine, or nitrogen ions implanted with an energy of between 100 kilo-electron volts (keV) and 300 keV with an implant dose of $1 \times 10^{14}$ ions/cm$^2$ to $1 \times 10^{16}$ ions/cm$^2$. The implant region implant creates damage in the isolation region 145 which results in increased resistance of the exposed layers such that acceptable isolation characteristics are achieved for the functionality of the GaN FET 102. The isolation region 145 may also be formed using a photolithography step to cover the GaN FET 102 leaving the isolation region 145 exposed, followed by a plasma etch process which removes the barrier layer 112, the optional high bandgap layer 110, the channel layer 108, and removes a portion of the buffer layer 106.

The method 200 continues with step 212 which includes forming an optional etch stop layer 116 on the barrier layer 112. The optional etch stop layer 116 has a higher aluminum content than the barrier layer 112. The optional etch stop layer 116 may include a primarily aluminum nitride semiconductor material. The optional etch stop layer 116 may be 0.5 nanometers to 3 nanometers thick, and may be formed by an etch stop MOVPE process similar to the high bandgap MOVPE process used to form the optional high bandgap layer 110. The optional etch stop layer 116 may advantageously reduce or eliminate etching of the barrier layer 112 during a subsequent gate etch process.

The method 200 continues with step 214 which includes forming a gate layer of III-N semiconductor material (not specifically shown) referred to herein as the gate layer, followed by a pattern and etch steps (not specifically shown) which define the subsequently-formed gate electrode 124 of p-type III-N semiconductor material over the barrier layer 112, on the optional etch stop layer 116, if present. The gate layer may include primarily gallium nitride, with magnesium dopant to provide p-type conductivity. In some versions of this example, the gate layer may include other group III elements, such as aluminum or indium, at less than 10 atomic percent.

The gate layer may be formed by a gate MOVPE process using a gallium-containing gas reagent, a nitrogen-containing gas reagent, and a p-type dopant gas reagent followed by a pattern and etch step to define the gate layer. The gallium-containing gas reagent may be implemented as trimethylgallium or triethylgallium, for example. The nitrogen-containing gas reagent may be implemented as ammonia, hydrazine, or 1,1 dimethylhydrazine, as disclosed in reference to forming the channel layer 108. The p-type dopant gas reagent may be implemented as bis(cyclopentadienyl) magnesium, by way of example. Other sources of magnesium-containing gas reagents are within the scope of this example. Further, other implementations of the p-type dopant gas to provide p-type dopants other than magnesium are also within the scope of this example. In versions of this example in which the p-type dopant is implemented as magnesium, the magnesium concentration in the gate layer may be $1 \times 10^{17}$ cm$^{-3}$ to $1 \times 10^{20}$ cm$^{-3}$, to provide a desired threshold potential for the Gan FET 102.

In versions of this example in which the gate layer includes aluminum, the gate MOVPE process uses an aluminum-containing gas reagent. The aluminum-containing gas reagent may be implemented as trimethylaluminum or triethylaluminum, as disclosed in reference to forming the barrier layer 112. In versions of this example in which the gate layer includes indium, the gate MOVPE process uses an indium-containing gas reagent. The indium-containing gas reagent may be implemented as trimethylindium or triethylindium, as disclosed in reference to forming the barrier layer 112. The gate layer formation MOVPE process uses a carrier gas. The carrier gas may include primarily hydrogen gas, or may include hydrogen with another gas such as nitrogen. The substrate 104 may be heated to 900° C. to 1100° C. during the gate MOVPE process.

The gate layer may be 5 nanometers to 500 nanometers thick, to provide a desired threshold potential for the GaN FET 102. The gate layer reduces the free charge carrier density in the 2DEG 114 by 25 percent to 99 percent, as a result of the work function of the gate layer reducing the quantum well in the channel layer 108. The 2DEG 114 retains a finite free charge carrier density of electrons after the gate electrode 124 is formed.

The method 200 continues with step 216 which includes patterning and etching the gate layer to define a gate electrode 124. In the gate electrode 124 formation, a gate mask (not specifically shown) is formed on the gate layer (not specifically shown), the gate mask covering an area of the gate layer for a subsequently-formed gate electrode 124. In one version of this example, the gate mask may include photoresist, formed directly by a photolithographic process. The gate mask may include organic anti-reflection material such as a bottom anti-reflection coat (BARC) layer under the photoresist. The BARC layer may be patterned after the photolithographic process is completed. In another version of this example, the gate mask may include inorganic hard mask material, such as silicon dioxide or silicon nitride. In a further version, the gate mask may include metal hard mask material, such as nickel. The hard mask material, inorganic or metal, may be patterned by forming a photoresist pattern over the hard mask material, followed by etching the hard mask material using a reactive ion etch (RIE) process using fluorine radicals or an ion milling process. A hard mask material in the gate mask may provide improved control of the lateral dimension of the gate electrode 124. The gate electrode 124 formation process continues with a gate etch process (not specifically shown) which removes the gate layer where exposed by the gate mask, leaving the gate layer under the gate mask to form the gate electrode 124. The gate etch process may be performed in an inductively coupled plasma (ICP) etcher, which generates a plasma containing chemically reactive neutral species, ions, and electrons. The gate etch process includes a chemical etchant species, a physical etchant species, and an aluminum passivating species. The chemical etchant species may be implemented as chlorine radicals, or bromine radicals, for example. The chlorine radicals may be provided by chlorine gas, silicon tetrachloride, boron trichloride, or a combination thereof. The bromine radicals may be provided by boron tribromide, for example.

The gate electrode 124 etch process may also include physical etchant species which may be implemented by one or more ion species. Examples of the physical etchant species include fluorine ions, noble gas ions such as argon ions or helium ions, and oxygen ions. Other ion species in the physical etchant species are within the scope if this example. The fluorine ions may be provided by silicon hexafluoride, carbon tetrafluoride, or nitrogen trifluoride, for example. The noble gas ions may be provided by argon gas or helium gas. The oxygen ions may be provided by oxygen gas or carbon monoxide gas, for example.

The gate electrode 124 etch process may also include an aluminum passivating species which may be implemented as oxygen radicals or fluorine radicals. The oxygen radicals may be provided by oxygen gas. The fluorine radicals may be provided by silicon hexafluoride, carbon tetrafluoride, or nitrogen trifluoride, for example.

The chemical etchant species binds to gallium atoms and nitrogen atoms in the gate layer. The physical etchant species impacts the gate layer and imparts sufficient energy to facilitate separation of the gallium atoms and nitrogen atoms that are bound to the chemical etchant species from the gate layer. The gallium atoms and nitrogen atoms that are separated from the gate layer are removed by the ICP etcher. The ICP etcher has a first power supply for forming a plasma which generates the chemical etchant species, the physical etchant species, and the aluminum passivating species, and a second power supply to independently control a potential difference between the plasma and the substrate 204. The first power supply may be operated at a power of 250 watts to 500 watts, for a 150 millimeter wafer, by way of example. The second power supply may be adjusted to operate initially at 20 watts to 100 watts, to provide an impact energy of the physical etchant species sufficient to facilitate separation of the gallium atoms and nitrogen atoms from the gate layer. As the gate etch process nears completion, the power level of the second power supply may be reduced, to 20 watts to 50 watts to reduce the energy provided for chemical reactions, which reduces removal of aluminum more significantly than removal of gallium, thus providing etch selectivity. Reducing the power level of the second power supply may thus decrease an etch rate of the optional etch stop layer 116, if present, or the barrier layer 112 if the optional etch stop layer 116, is not present, relative to the gate layer, because the gate layer includes more gallium and less aluminum than the optional etch stop layer 116 and the barrier layer 112.

The gate etch process may be performed at a pressure 10 millitorr to 50 millitorr, to improve the etching selectivity. The aluminum passivating species further improves the etching selectivity by combining preferentially with aluminum in the optional etch stop layer 116, if present, or in the barrier layer 112 if the optional etch stop layer 116, is not present, minimizing the sites available for the chemical etchant species to react with the gallium and nitrogen. Thus, the gate etch process may remove the gate layer completely where exposed by the gate mask, without removing a significant amount of the optional etch stop layer 116 or the barrier layer 112. The gate etch process may be continued in an over-etch step, after the gate layer is removed outside of the gate electrode 124. Reducing the power level of the second power supply and providing the aluminum passivating species may advantageously enable complete removal of the gate layer across the substrate 104, despite variations in thickness of the gate layer across the substrate 104, without removing a significant amount of the optional etch stop layer 116 or the barrier layer 112.

The 2DEG 114 includes a channel region 126 under the gate electrode 124. The free charge carrier density in the channel region 126 remains at the low value, because the thickness of the gate layer remains constant in the gate electrode 124. The 2DEG 114 includes access regions 128 adjacent to the channel region 126. As the gate layer is removed, the free charge carrier density in the 2DEG 114 increases in the access regions 128, where the gate layer is removed.

The 2DEG 214 includes a source region 130 in an area for a source of the GaN FET 102. The source region 130 is laterally separated from the channel region 126 by one of the access regions 128. The 2DEG 114 includes a drain region 132 in an area for a drain of the GaN FET 102. The drain region 132 is laterally separated from the channel region 226 by another of the access regions 128, and is located opposite from the source region 130.

The free charge carrier density of the 2DEG 114 in the access regions 128 after the gate electrode 124 formation may increase to a value comparable to the free charge carrier density before the gate layer was formed. The free charge carrier density of the 2DEG 114 in the access regions 128 may be $3 \times 10^{12}$ cm$^{-2}$ to $2 \times 10^{13}$ cm$^{-2}$, to provide the desired on-state resistance for the GaN FET 102. The channel region 126 of the 2DEG 114 retains a non-zero density of electrons, 1 percent to 75 percent of the free charge carrier density of the 2DEG 114 in the access regions 128.

A bottom surface 136 of the gate electrode 124, adjacent to the barrier layer 112, does not extend past a top surface 138 of the barrier layer 112, located opposite from the channel layer 108, advantageously enabling the GaN FET 102 to be formed without a gate recess etch, which would increase fabrication cost and complexity. The GaN FET 102 may be free of any dielectric material between the gate electrode 124 and the barrier layer 112, advantageously enabling the GaN FET 102 to be formed without forming a gate dielectric layer, which would also increase fabrication cost and complexity. The GaN FET 102 may be free of III-N semiconductor material adjacent to the gate electrode 124, extending above the bottom surface 136 of the gate electrode 124, advantageously enabling the GaN FET 102 to be formed without forming a barrier regrowth layer, which would further increase fabrication cost and complexity.

The method 200 continues with step 218 which includes forming a dielectric layer 134 over the gate electrode 124 and over the barrier layer 112 adjacent to the gate electrode 124. The dielectric layer 134 may include one or more sublayers of silicon dioxide, silicon nitride, aluminum oxide, or any combination thereof. The dielectric layer 134 may be formed by one or more low pressure chemical vapor deposition (LPCVD) processes, plasma enhanced chemical vapor deposition (PECVD) processes, high density plasma (HDP) processes, or atomic layer deposition (ALD) processes, by way of example. The dielectric layer 134 may advantageously protect the gate electrode 124 and the barrier layer 112 from physical or chemical degradation.

The method 200 continues with step 220 which includes formation of source contacts 144 to the source region 130, drain contacts 142 to the drain region 132 and forming gate contacts 143 to the gate electrode 124. The gate contact 143 is formed through the dielectric layer 134, contacting the gate electrode 124. The gate contact 143 may be aligned with an opening through the dielectric layer 134, or may extend partway over the dielectric layer 134 around the opening. A row of drain contacts 142 is formed through the dielectric layer 134 and the barrier layer 112, contacting the 2DEG 114 at the drain region 132 with an end drain contact 142 closest to the gate electrode fingertip 190. A row of source contacts 144 are formed through the dielectric layer 134 and the barrier layer 112, contacting the 2DEG 114 at the source region 130 with an end source contact 144 closest to the gate electrode fingertip 190. The gate contact 143, the drain contact 142, and the source contact 144 are electrically conductive, and may include one or more metals, such as titanium, tungsten, or aluminum, or may include other electrically conductive material such as carbon nanotubes or graphene. The microelectronic device 100 contains a drain contact to end of gate electrode fingertip space 152 and a source contact to end of gate electrode fingertip space 154. A delta contact space 155 is defined as the source contact to end of gate electrode fingertip space 154 minus the drain contact to end of gate electrode fingertip space 152. The microelectronic device 100 also has a minimum drain contact to gate electrode space 156 and a minimum source contact to gate electrode space 158. In FIG. 1A, the delta contact space 155 is greater than two times the minimum source contact to gate electrode space 158.

Figure 3:
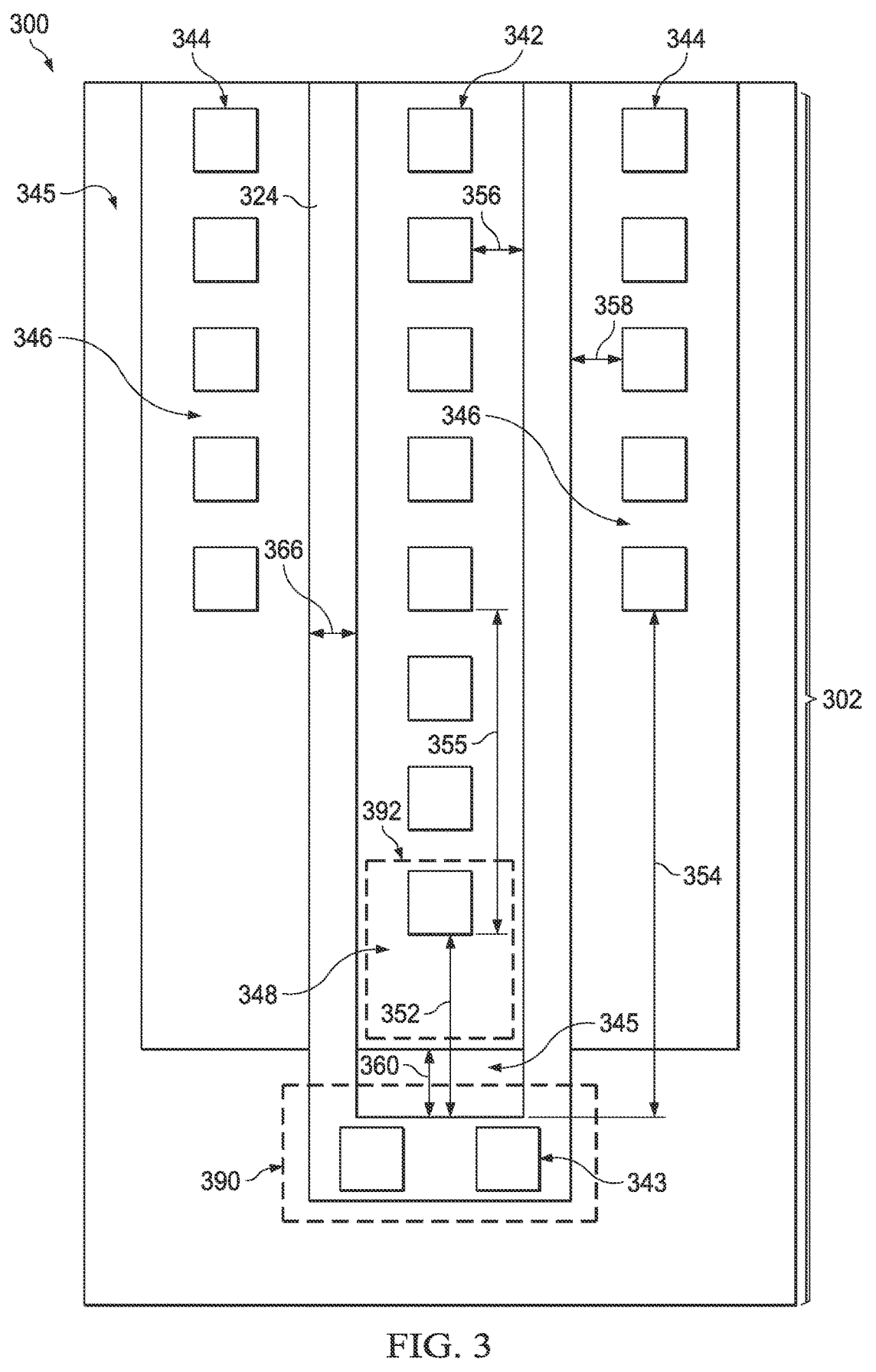

FIG. 3 shows a top down view of a microelectronic device 300 containing a GaN FET 302. The GaN FET 302 contains a source access region 346, and a drain access region 348, a gate electrode 324 between the source access region 346 and the drain access region 348, a row of source contacts 344 in the source access region 346 with and end source contact 344 closest to the gate electrode fingertip 390, a row of drain contacts 342 in the drain access region 348 with an end drain contact 342 closest to the gate electrode fingertip 390, gate contacts 343 on the gate electrode fingertip 390 which is part of the gate electrode 324. The gate electrode 324 has a minimum gate length 366. The microelectronic device 300 contains a drain contact to end of gate electrode fingertip space 352 and a source contact to end of gate electrode fingertip space 354. The gate electrode 324 extends past the end of the drain access region 348 by a drain end to gate space 360. A delta contact space 355 is defined as the source contact to end of gate electrode fingertip space 354 minus the drain contact to end of gate electrode fingertip space 352. The microelectronic device 300 also has a minimum drain contact to gate electrode space 356 and a minimum source contact to gate electrode space 358. In FIG. 3, the delta contact space 355 is greater than two times the minimum source contact to gate electrode space 358 that is, the drain contacts 342 extend past the source contacts 344 by at least 2 times the drain contact to end of gate electrode fingertip space 352. The gate electrode 324 extends past the end of the drain access region 348 by a drain end to gate space 360. The complete end drain contact 342 extends past the end source contact 344 in a direction toward the gate electrode fingertip area 392. FIG. 3 shows multiple drain contacts 342 (e.g., 3) extending past the end source contact 344 in the direction toward the gate electrode fingertip area 392. It is advantageous in the layout shown in FIG. 3 for the drain contacts 342 to be closer to the end of the gate electrode fingertip 390 than the source contacts 344 by a distance such that the delta contact space 355 is greater than two times the minimum source contact to gate electrode space 358, as a delta contact space 355 which is larger than two times the minimum source contact to gate electrode space 358 reduces current crowding in the drain contact to gate electrode fingertip area 392 which results in improved hard switching reliability. In addition, when the gate electrode fingertip 390 terminates on isolation 345 is advantageous as it suppresses current crowding in the drain contact to gate electrode fingertip area 392 during hard switching but can result in parasitic leakage and degraded time dependent dielectric breakdown (TDDB) reliability.

Figure 4:
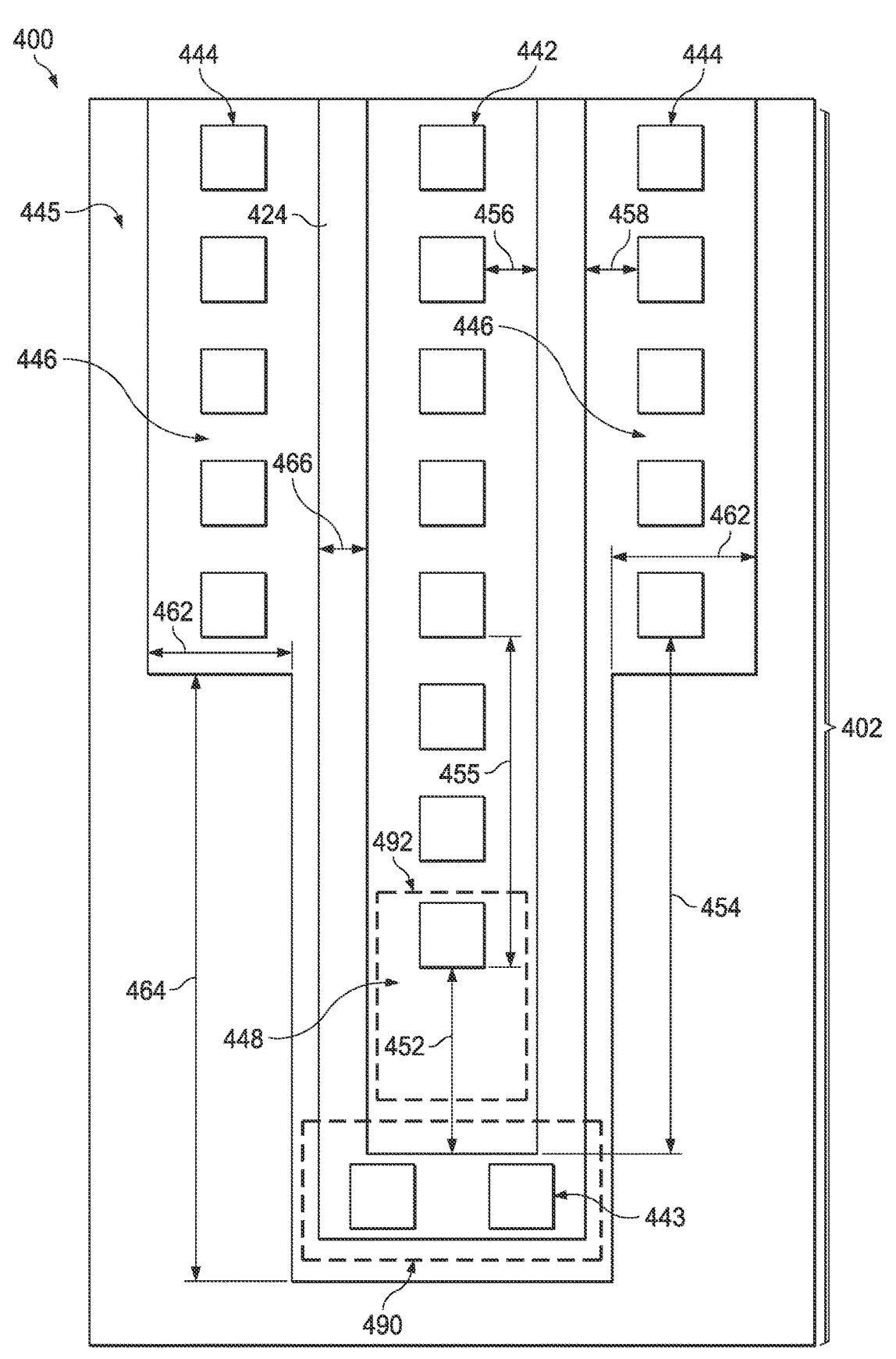
FIG. 4 is a top down view of a GaN FET with a gate electrode terminating on the active region, a difference in distance between source and drain contacts to the termination of the gate electrode fingertip, and a narrowed source active region near the termination of the gate electrode fingertip.

FIG. 4 shows a top down view of a microelectronic device 400 containing a GaN FET 402. The GaN FET 402 contains a source access region 446, and a drain access region 448, a gate electrode 424 between the source access region 446 and the drain access region 448, a row of source contacts 444 in the source access region 446 with an end source contact 444 closest to the gate electrode fingertip 490, a row of drain contacts 442 in the drain access region 448 with an end drain contact 442 closest to the gate electrode fingertip 490, gate contacts 443 on the gate electrode fingertip 490 which is part of the gate electrode 424. The gate electrode 424 has a minimum gate length 466. The microelectronic device 400 contains a drain contact to end of gate electrode fingertip space 452 and a source contact to end of gate electrode fingertip space 454. A delta contact space 455 is defined as the source contact to end of gate electrode fingertip space 454 minus the drain contact to end of gate electrode fingertip space 452. The source access region 446 is narrowed by a source shoulder 462 length, and resulting in a narrow active region tab distance 464. The microelectronic device 400 also has a minimum drain contact to gate electrode space 456 and a minimum source contact to gate electrode space 458. In FIG. 4, the delta contact space 455 is greater than two times the minimum source contact to gate electrode space 458 that is, the drain contacts 442 extend past the source contacts 444 by at least 2 times the drain contact to end of gate electrode fingertip space 452. The complete end drain contact 442 extends past the end source contact 444 in a direction toward the gate electrode fingertip area 492. FIG. 4 shows multiple drain contacts 442 (e.g., 3) extending past the end source contact 444 in the direction toward the gate electrode fingertip area 492. It is advantageous in the layout shown in FIG. 4 for the drain contacts 442 to be closer to the end of the gate electrode fingertip 490 than the source contacts 444 by a distance such that the delta contact space 455 is greater than two times minimum source contact to gate electrode space 458 as a delta contact space 455 which is larger than two times minimum source contact to gate electrode space 458 reduces current crowding in the drain contact to gate electrode fingertip area 492 which results in improved hard switching reliability. Creating a narrow active region tab distance 464, is also advantageous as the effective source width is decreased and the source resistance is increased which provides additional benefit in suppressing current crowding in the GaN FET 402.

Figure 5:
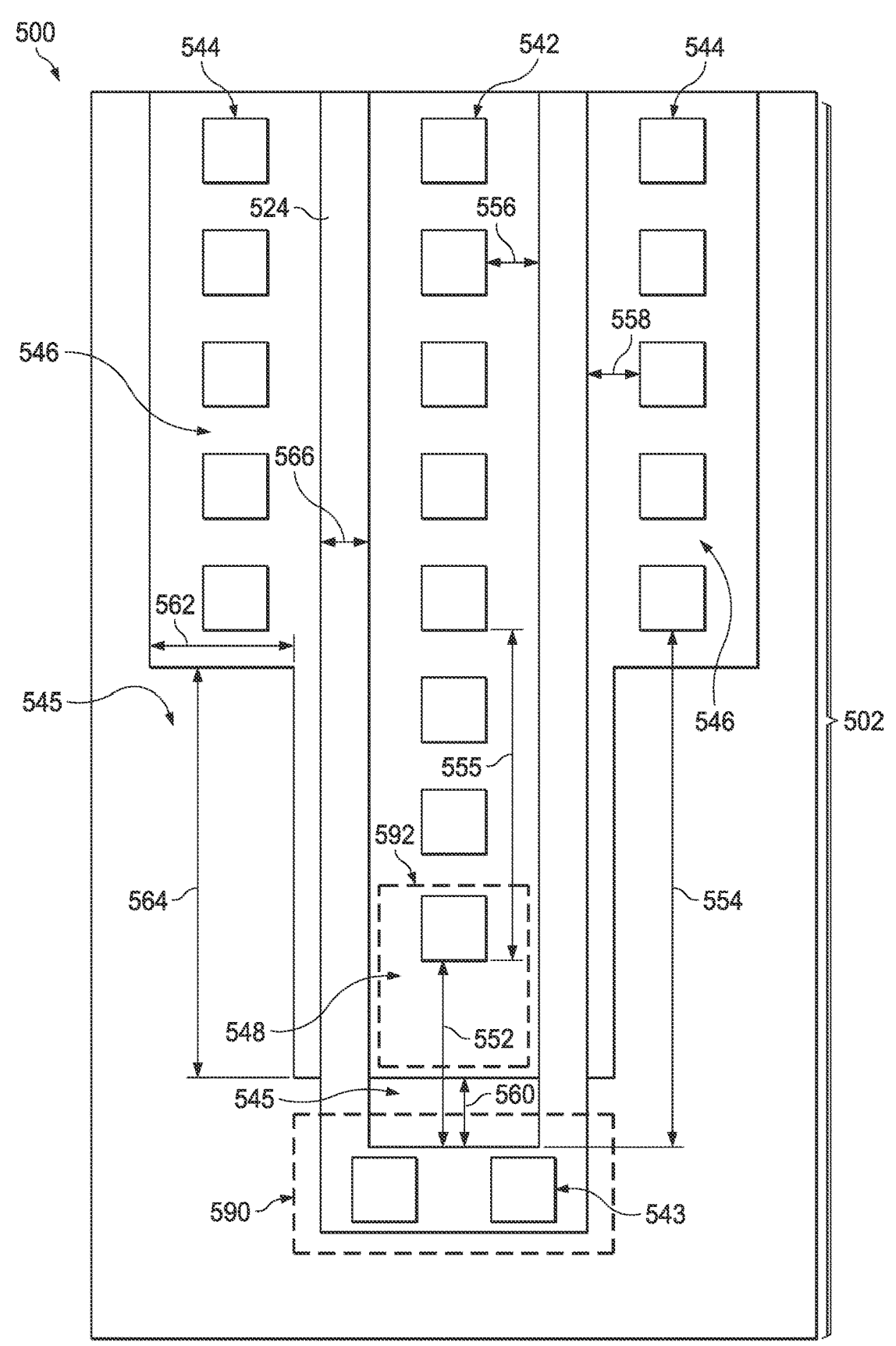
FIG. 5 is a top down view of a GaN FET with a gate electrode fingertip terminating on isolation, a difference in distance between source and drain contacts to the termination of the gate electrode fingertip, and a narrowed source active region near the termination of the gate electrode fingertip.
Figure 6:
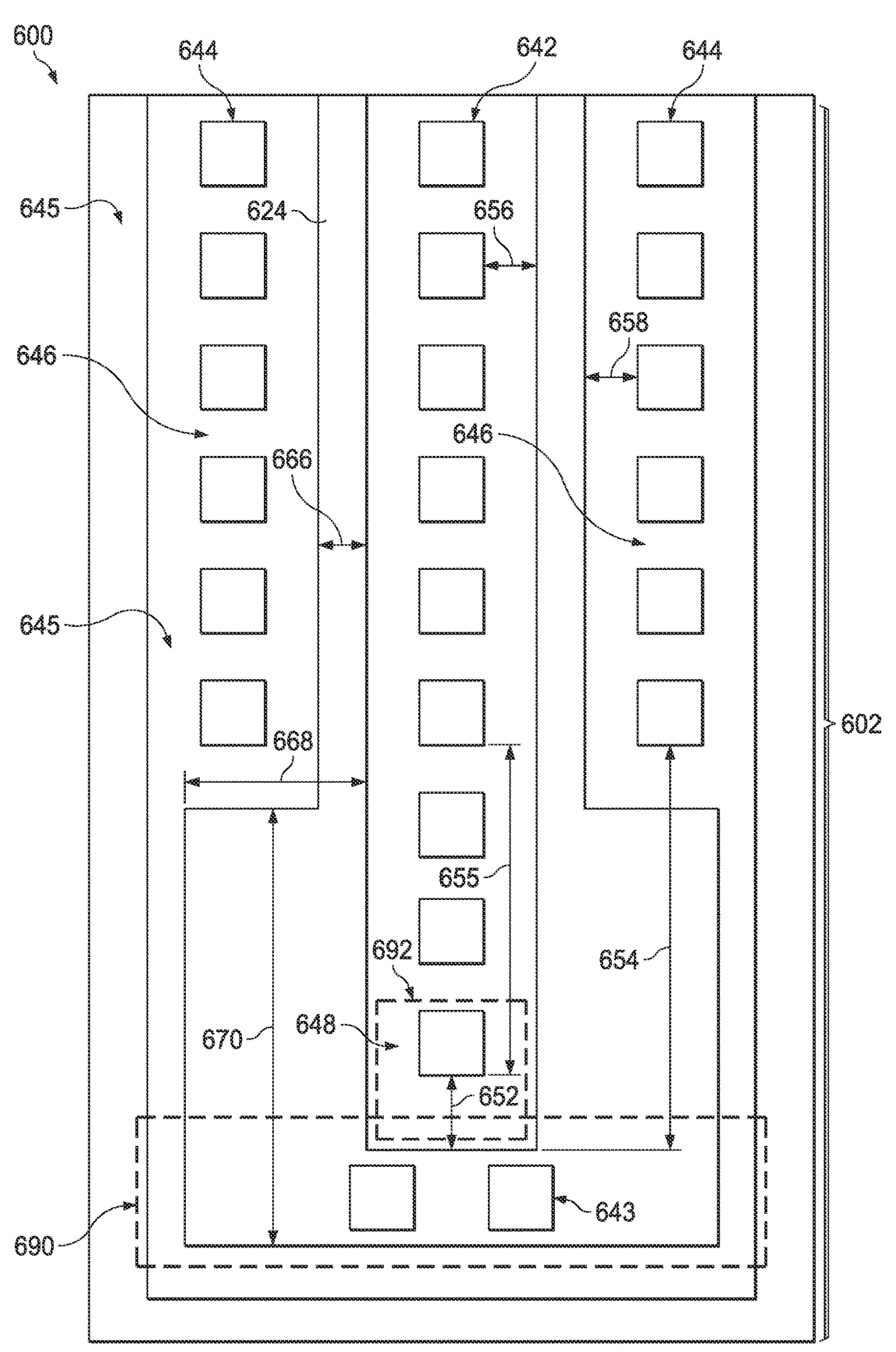
FIG. 6 is a top down view of a GaN FET with a gate electrode terminating on the active region, a difference in distance between source and drain contacts to the termination of the gate electrode fingertip, and a gate electrode with fingertip with a longer gate electrode length and gate electrode width in the region of the termination of the gate electrode fingertip.

FIG. 5 shows a top down view of a microelectronic device 500 containing a GaN FET 502. The GaN FET 502 contains a source access region 546, and a drain access region 548, a gate electrode 524 between the source access region 546 and the drain access region 548, a row of source contacts 544 in the source access region 546 with an end source contact 544 closest to the gate electrode fingertip 590, a row of drain contacts 542 in the drain access region 548 with an end drain contact 542 closest to the gate electrode fingertip 590, gate contacts 543 on the gate electrode fingertip 590 which is part of the gate electrode 524. The gate electrode 524 has a minimum gate length 566. The microelectronic device 500 contains a drain contact to end of gate electrode fingertip space 552 and a source contact to end of gate electrode fingertip space 554. A delta contact space 555 is defined as the source contact to end of gate electrode fingertip space 554 minus the drain contact to end of gate electrode fingertip space 552. The microelectronic device 500 also has a minimum drain contact to gate electrode space 556 and a minimum source contact to gate electrode space 558. The gate electrode 524 extends past the end of the drain access region 548 by a drain end to gate space 560. In FIG. 5, the delta contact space 555 is greater than two times the minimum source contact to gate electrode space 558 that is, the drain contacts 542 extend past the source contacts 544 by at least 2 times the drain contact to end of gate electrode fingertip space 552. The complete end drain contact 542 extends past the end source contact 544 in a direction toward the gate electrode fingertip area 592. FIG. 5 shows multiple drain contacts 542 (e.g., 3) extending past the end source contact 544 in the direction toward the gate electrode fingertip area 592. It is advantageous in the layout shown in FIG. 5 for the drain contacts 542 to be closer to the end of the gate electrode fingertip 590 than the source contacts 544 by a distance such that the delta contact space 555 is greater than two times the minimum source contact to gate electrode space 558, as a delta contact space 555 which is larger than two times the minimum source contact to gate electrode space 558 reduces current crowding in the drain contact to gate electrode fingertip area 592 which results in improved hard switching reliability. In addition, when the gate electrode fingertip 590 terminates on isolation 545 is advantageous as it suppresses current crowding in the drain contact to gate electrode fingertip area 592 during hard switching, FIG. 6 shows a top down view of a microelectronic device 600 containing a GaN FET 602. The GaN FET 602 contains a source access region 646, and a drain access region 648, a gate electrode 624 between the source access region 646 and the drain access region 648, a row of source contacts 644 in the source access region 646 with an end source contact 644 closest to the gate electrode fingertip 690, a row of drain contacts 642 in the drain access region 648 with an end drain contact 642 closest to the gate electrode fingertip 690, gate contacts 643 on the gate electrode fingertip 690 which is part of the gate electrode 624. The gate electrode 624 has a minimum gate length 666. The microelectronic device 600 contains a drain contact to end of gate electrode fingertip space 652 and a source contact to end of gate electrode fingertip space 654. The GaN FET 602 also has an end of gate electrode finger width 668 and an end of gate electrode finger length 670 which are both larger than the minimum gate length 666. A delta contact space 655 is defined as the source contact to end of gate electrode fingertip space 654 minus the drain contact to end of gate electrode fingertip space 652. The microelectronic device 600 also has a minimum drain contact to gate electrode space 656 and a minimum source contact to gate electrode space 658. In FIG. 3, the delta contact space 655 is greater than two times the minimum source contact to gate electrode space 658 that is, the drain contacts 642 extend past the source contacts 644 by at least 2 times the drain contact to end of gate electrode fingertip space 652. The complete end drain contact 642 extends past the end source contact 644 in a direction toward the gate electrode fingertip area 692. FIG. 6 shows multiple drain contacts 642 (e.g., 3) extending past the end source contact 644 in the direction toward the gate electrode fingertip area 692. It is advantageous in the layout shown in FIG. 6 for the drain contacts 642 to be closer to the end of the gate electrode fingertip 690 than the source contacts 644 by a distance such that the delta contact space 655 is greater than two times the minimum source contact to gate electrode space 658, as a delta contact space 655 which is larger than two times the minimum source contact to gate electrode space 658 reduces current crowding in the drain contact to gate electrode fingertip area 692 which results in improved hard switching reliability. It is also advantageous for the end of gate electrode finger width 668 and an end of gate electrode finger length 670 to be larger than the minimum gate length 666 as the larger end of gate electrode finger width 668 and an end of gate electrode finger length 670 result in a longer effective gate length near the end of the gate electrode finger and reduces current crowding during hard switching.

Figure 7:
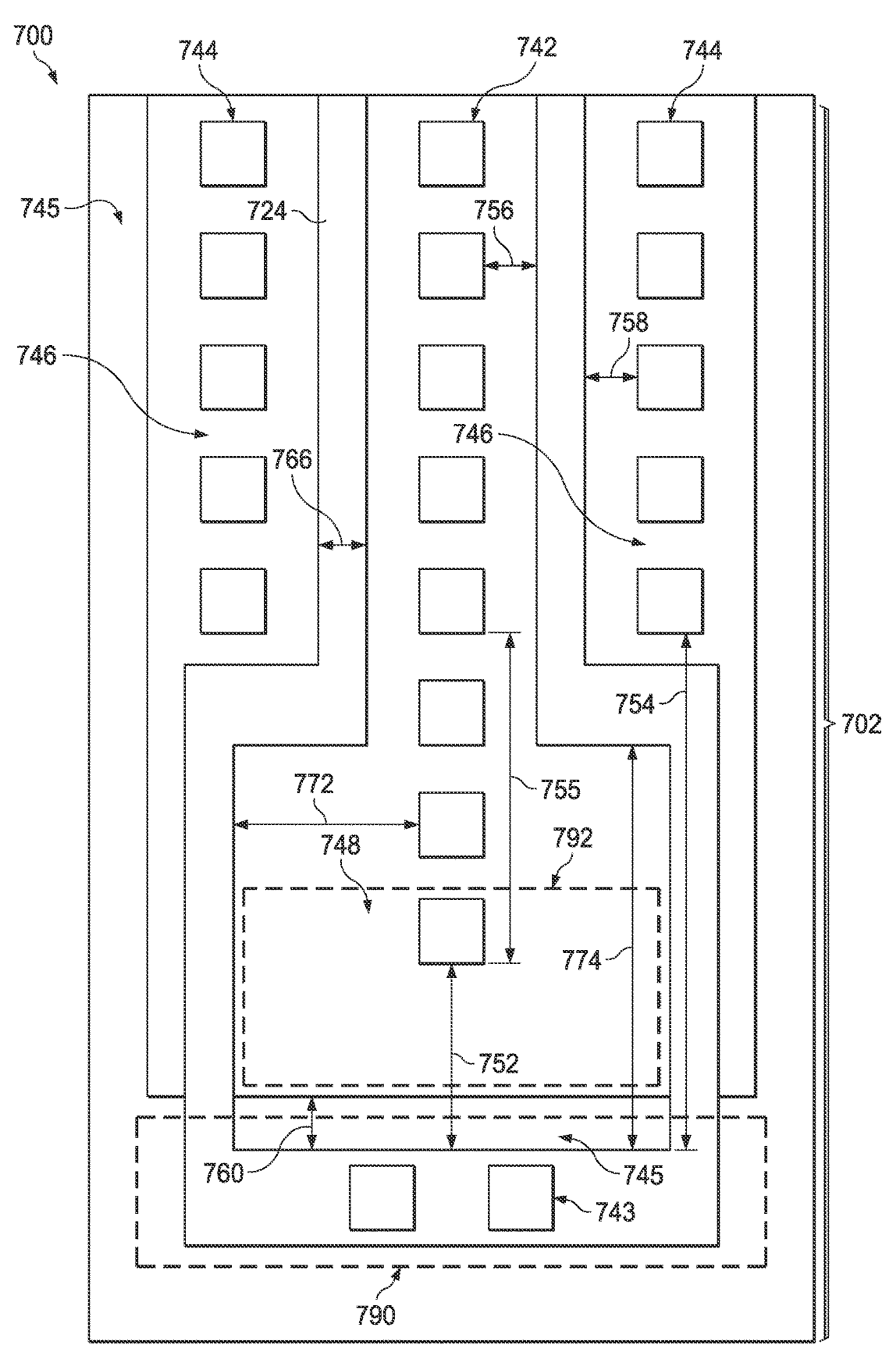
FIG. 7 is a top down view of a GaN FET with a gate electrode fingertip terminating on isolation, a difference in distance between the source and drain contacts to the termination of the gate electrode fingertip, generous drain contact to gate electrode spacing in the region of the termination of the gate electrode fingertip.

FIG. 7 shows a top down view of a microelectronic device 700 containing a GaN FET 702. The GaN FET 702 contains a source access region 746, and a drain access region 748, a gate electrode 724 between the source access region 746 and the drain access region 748, a row of source contacts 744 in the source access region 746 with an end source contact 744 closest to the gate electrode fingertip 790, a row of drain contacts 742 in the drain access region 748 with an end drain contact 742 closest to the gate electrode fingertip 790, gate contacts 743 on the gate electrode fingertip 790 which is part of the gate electrode 724. The gate electrode 724 has a minimum gate length 766. The microelectronic device 700 contains a drain contact to end of gate electrode fingertip space 752 and a source contact to end of gate electrode fingertip space 754. A delta contact space 755 is defined as the source contact to end of gate electrode fingertip space 754 minus the drain contact to end of gate electrode fingertip space 752. The microelectronic device 700 also has a minimum drain contact to gate electrode space 756 and a minimum source contact to gate electrode space 758. The gate in FIG. 7 overlaps the isolation 745 by a drain end to gate space 760, but the gate electrode 724 may also be entirely on the active region. The gate electrode 724 of FIG. 7 contains a region of relaxed drain contact to gate space 772 with a relaxed drain contact to gate electrode length 774. In FIG. 7, the delta contact space 755 is greater than two times the minimum source contact to gate electrode space 758 that is, the drain contacts 742 extend past the source contacts 744 by at least 2 times the drain contact to end of gate electrode fingertip space 752. The complete end drain contact 742 extends past the end source contact 744 in a direction toward the gate electrode fingertip area 792. FIG. 7 shows multiple drain contacts 742 (e.g., 3) extending past the end source contact 744 in the direction toward the gate electrode fingertip area 792. It is advantageous in the layout shown in FIG. 7 for the drain contacts 742 to be closer to the end of the gate electrode fingertip 790 than the source contacts 744 by a distance such that the delta contact space 755 is greater than two times minimum source contact to gate electrode space 758, as a delta contact space 755 which is larger than two times the minimum source contact to gate electrode space 758 reduces current crowding in the drain contact to gate electrode fingertip area 792 which results in improved hard switching reliability. The relaxed drain contact to gate space 772 with relaxed drain contact to gate electrode length 774 also may improve hard switching reliability by reducing current crowding near the end of the gate electrode finger. In addition, when the gate electrode fingertip 790 terminates on isolation 745 is advantageous as it suppresses current crowding in the drain contact to gate electrode fingertip area 792 during hard switching.

Figure 8:
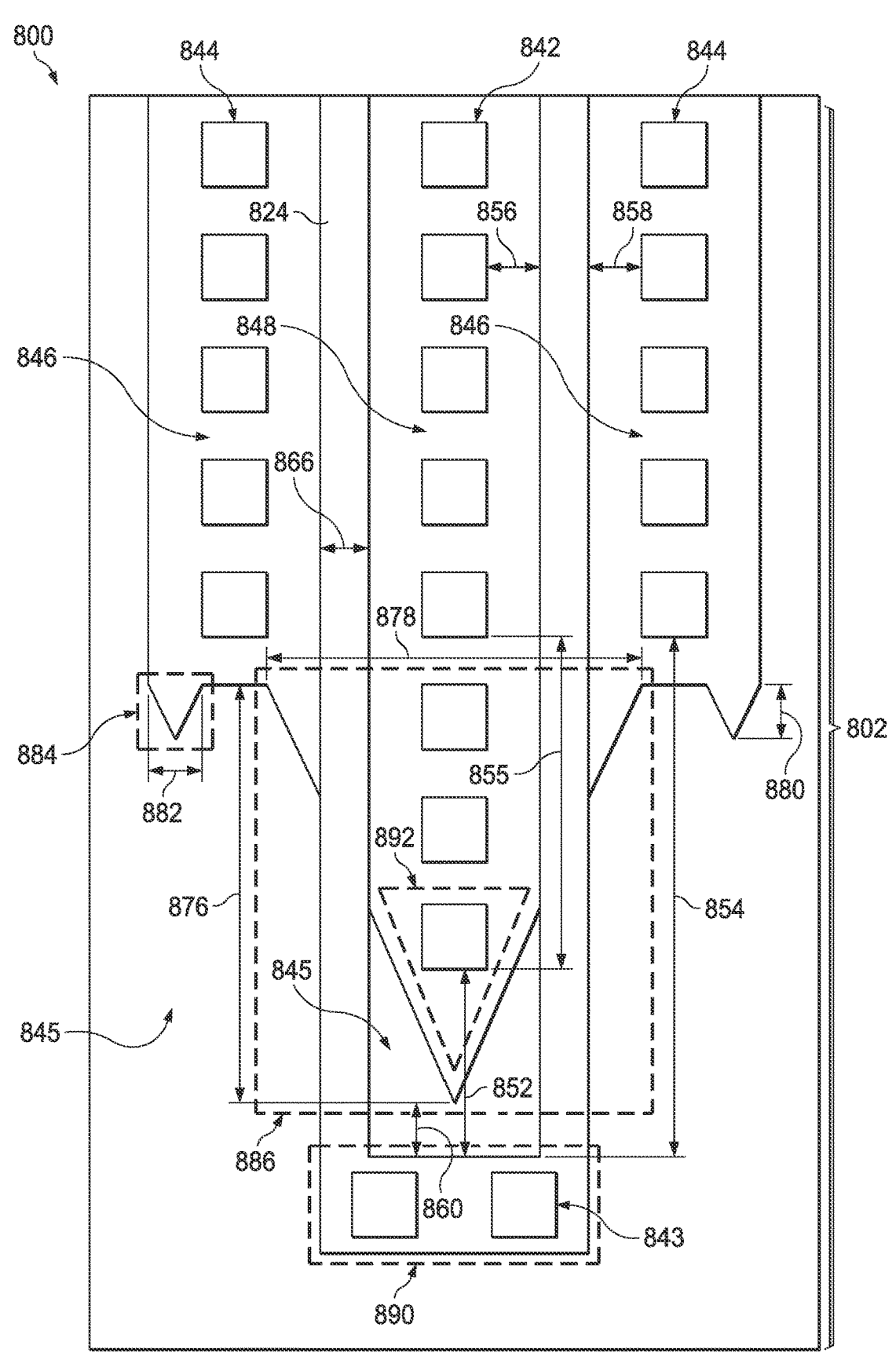
FIG. 8 is a top down view of a GaN FET with a gate electrode fingertip terminating on isolation, a difference in distance between the source and drain contacts to the termination of the gate electrode fingertip, and a drain region which has a triangular endpoint and source regions which contain triangular endpoint protrusions.

FIG. 8 shows a top down view of a microelectronic device 800 containing a GaN FET 802. The GaN FET 802 contains a source access region 846, and a drain access region 848, a gate electrode 824 between the source access region 846 and the drain access region 848, row of source contacts 844 in the source access region 846 with an end source contact 844 closest to the gate electrode fingertip 890, a row of drain contacts 842 in the drain access region 848 with an end drain contact 842 closest to the gate electrode fingertip 890, gate contacts 843 on the gate electrode fingertip 890 which is part of the gate electrode 824. The gate electrode 824 has a minimum gate length 866. The GaN FET 802 contains a drain contact to end of gate electrode fingertip space 852 and a source contact to end of gate electrode fingertip space 854. A delta contact space 855 is defined as the source contact to end of gate electrode fingertip space 854 minus the drain contact to end of gate electrode fingertip space 852. The microelectronic device 800 also has a minimum drain contact to gate electrode space 856 and a minimum source contact to gate electrode space 858. The GaN FET 802 contains drain end protrusion 886 with a drain end protrusion length 876 and a drain end protrusion width 878 of a generally triangular shape, but may be trapezoidal or a semicircular in shape. The GaN FET 802 contains source end protrusion 884 with a source end protrusion length 880 and a source end protrusion width 882 of a generally triangular shape but may be trapezoidal or a semicircular. The gate electrode 824 extends past the end of the drain access region 848 by a drain end to gate space 860. In FIG. 8, the delta contact space 855 is greater than two times the minimum source contact to gate electrode space 858 that is, the drain contacts 842 extend past the source contacts 844 by at least 2 times the drain contact to end of gate electrode fingertip space 852. The complete end drain contact 842 extends past the end source contact 844 in a direction toward the gate electrode fingertip area 892. FIG. 8 shows multiple drain contacts 842 (e.g., 3) extending past the end source contact 844 in the direction toward the gate electrode fingertip area 892. It is advantageous in the layout shown in FIG. 8 for the drain contacts 842 to be closer to the end of the gate electrode fingertip 890 than the source contacts 844 by a distance such that the delta contact space 855 is greater than two times the minimum source contact to gate electrode space 858, as a delta contact space 855 which is larger than two times the minimum source contact to gate electrode space 858 reduces current crowding in the drain contact to gate electrode fingertip area 892 which results in improved hard switching reliability. In addition, when the gate electrode fingertip 890 terminates on isolation 845 it is advantageous as it suppresses current crowding in the drain contact to gate electrode fingertip area 892 during hard switching. The drain end protrusion 886 and source end protrusion 884 may be advantageous in minimizing the gate electrode finger active area which reduces current crowding in the drain contact to gate electrode fingertip area 892 and thus improves hard switching reliability.

What is claimed is:

1. A gallium nitride field effect transistor, comprising:
a gate electrode with a gate electrode fingertip; and
a plurality of source contacts to a source region, and a
    plurality of drain contacts to a drain region, wherein:
each source contact of the plurality of source contacts is
    separated from the gate electrode by a first distance in
    a first direction;
a source contact of the plurality of source contacts, which
    is closest to the gate electrode fingertip, is separated
    from the gate electrode fingertip by a second distance
    in a second direction perpendicular to the first direc-
    tion;
a drain contact of the plurality of drain contacts, which is
    closest to the gate electrode fingertip, is separated from
    the gate electrode fingertip by a third distance in the
    second direction, the third distance less than the second
    distance; and
the plurality of drain contacts includes two or more drain
    contacts that are fully past the source contact which is
    closest to the gate electrode fingertip in the second
    direction, wherein the two or more drain contacts
    include the drain contact which is closest to the gate
    electrode fingertip.

2. The gallium nitride field effect transistor of claim 1, wherein the gate electrode has an end of gate electrode finger width and an end of gate electrode finger length, both of which being greater than a minimum gate electrode length.

3. The gallium nitride field effect transistor of claim 1, wherein the first distance corresponds to a minimum source contact to gate electrode space.

4. The gallium nitride field effect transistor of claim 1, wherein the second distance is greater than the third distance by at least 2 times the first distance.

5. The gallium nitride field effect transistor of claim 1, wherein the second distance is greater than the first distance.

6. The gallium nitride field effect transistor of claim 1, wherein the gate electrode laterally surrounds the drain region.

7. The gallium nitride field effect transistor of claim 1, wherein the source region laterally surrounds the gate electrode.

8. The gallium nitride field effect transistor of claim 1, wherein an isolation region laterally surrounds the source region.

9. The gallium nitride field effect transistor of claim 8, wherein the isolation region is damaged by argon, silicon, fluorine, or nitrogen.

10. The gallium nitride field effect transistor of claim 1, wherein the gallium nitride field effect transistor is a deple-tion mode transistor.

11. The gallium nitride field effect transistor of claim 1, wherein the gallium nitride field effect transistor is an enhancement mode transistor.

12. The gallium nitride field effect transistor of claim 1, wherein the gate electrode includes a p-type III-N semicon-ductor material.

13. The gallium nitride field effect transistor of claim 1, further comprising:
a channel layer including a first III-N semiconductor
    material;
a high bandgap layer on the channel layer, the high
    bandgap layer including a second III-N semiconductor
    material; and a barrier layer on the high bandgap layer, the barrier layer
    including a third III-N semiconductor material having
    a bandgap less than the second III-N semiconductor
    material of the high bandgap layer.

14. A method of forming a gallium nitride field effect transistor (GaN FET), comprising:
forming a gate electrode with a gate electrode fingertip;
    and
forming plurality of source contacts to a source region,
    and a plurality of drain contacts to a drain region,
    wherein:
each source contact of the plurality of source contacts is
    separated from the gate electrode by a first distance in
    a first direction;
a source contact of the plurality of source contacts, which
    is closest to the gate electrode fingertip, is separated
    from the gate electrode fingertip by a second distance
    in a second direction perpendicular to the first direc-
    tion;
a drain contact of the plurality of drain contacts, which is
    closest to the gate electrode fingertip, is separated from
    the gate electrode fingertip by a third distance in the
    second direction, the third distance less than the second
    distance; and
the plurality of drain contacts include two or more drain
    contacts that are fully past the source contact which is
    closest to the gate electrode fingertip in the second
    direction, wherein the two or more drain contacts
    include the drain contact which is closest to the gate
    electrode fingertip.

15. The method of claim 14, wherein the gate electrode has an end of gate electrode finger width and an end of gate electrode finger length, both of which being greater than a minimum gate electrode length.

16. The method of claim 14, wherein the first distance corresponds to a minimum source contact to gate electrode space.

17. The method of claim 14, wherein the second distance is greater than the third distance by at least 2 times the first distance.

18. The method of claim 14, wherein the second distance is greater than the first distance.

19. The method of claim 14, wherein the gate electrode has an end of gate electrode finger width that is greater than a minimum gate electrode length.

20. The method of claim 14, wherein the GaN FET is a depletion mode transistor.

21. The method of claim 14, wherein the GaN FET is an enhancement mode transistor.

22. The method of claim 14, wherein the gate electrode includes a p-type III-N semiconductor material.

23. The method of claim 14, further comprising:
forming a channel layer including a first III-N semicon-
    ductor material;
forming a high bandgap layer on the channel layer, the
    high bandgap layer including a second III-N semicon-
    ductor material; and
forming a barrier layer on the high bandgap layer, the
    barrier layer including a third III-N semiconductor
    material having a bandgap less than the second III-N
    semiconductor material of the high bandgap layer.

24. A microelectronic device, comprising:
a gallium nitride field effect transistor (GaN FET), includ-
    ing:
a gate electrode with a gate electrode fingertip;
a row of source contacts including an end source contact;
    and a row of drain contacts including an end drain contact, wherein the end drain contact and at least one other drain contact are fully past the end source contact in a direction toward the gate electrode fingertip.

25. The microelectronic device of claim 24, wherein:

the row of drain contacts is located in a drain region of the GaN FET; and the gate electrode laterally surrounds the drain region.

26. The microelectronic device of claim 24, wherein:

the row of source contacts is located in a source region of the GaN FET; and the source region laterally surrounds the gate electrode.

27. The microelectronic device of claim 24, wherein the GaN FET further comprises an isolation region laterally surrounding an active region.

28. The microelectronic device of claim 24, wherein:

the row of source contacts is located in a source region of the GaN FET; and an isolation region of the GaN FET laterally surrounds the source region.

29. The microelectronic device of claim 24, wherein:

the end source contact is separated from the gate electrode by a first distance in a first direction;

the end source contact is separated from the gate electrode fingertip by a second distance in a second direction perpendicular to the first direction; and the end drain contact is separated from the gate electrode fingertip by a third distance in the second direction, the third distance less than the second distance.

30. The microelectronic device of claim 29, wherein the second distance is greater than the third distance by at least 2 times the first distance.

31. The microelectronic device of claim 29, wherein the second distance is greater than the first distance.

32. The microelectronic device of claim 24, wherein the GaN FET is a depletion mode transistor.

33. The microelectronic device of claim 24, wherein the GaN FET is an enhancement mode transistor.

34. The microelectronic device of claim 24, wherein the gate electrode includes a p-type III-N semiconductor material.

35. The microelectronic device of claim 24, wherein the gate electrode of the GaN FET has an end of gate electrode finger width and an end of gate electrode finger length, both of which being greater than a minimum gate electrode length.

36. The microelectronic device of claim 24, wherein the GaN FET further comprises:

a channel layer including a first III-N semiconductor material;

a high bandgap layer on the channel layer, the high bandgap layer including a second III-N semiconductor material; and a barrier layer on the high bandgap layer, the barrier layer including a third III-N semiconductor material having a bandgap less than the second III-N semiconductor material of the high bandgap layer.

* * * * *